(12) United States Patent
Walker

(10) Patent No.: US 6,445,247 B1
(45) Date of Patent: Sep. 3, 2002

(54) SELF-CONTROLLED HIGH EFFICIENCY POWER AMPLIFIER

(75) Inventor: Gordon Kent Walker, Poway, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/872,845

(22) Filed: Jun. 1, 2001

(51) Int. Cl.[7] .................................................. H03F 3/38
(52) U.S. Cl. .......................................... 330/10; 330/136
(58) Field of Search ........................... 330/10, 129, 136, 330/285

(56) References Cited

U.S. PATENT DOCUMENTS 4,220,914 A * 9/1980 Hekimian .............. 324/57 DE
6,107,880 A * 8/2000 Shaw ....................... 330/136
6,175,273 B1 * 1/2001 Sigmon et al. ................ 330/10

* cited by examiner

Primary Examiner—Robert Pascal
Assistant Examiner—Henry Choe
(74) Attorney, Agent, or Firm—Philip R. Wadsworth; Charles D. Brown; George C. Poppas

(57) ABSTRACT

A novel and improved circuit and method for amplifying an input signal. The circuit includes an amplifier circuit having an input for receiving the input signal, and an amplifier control circuit, coupled to the amplifier circuit, for varying a supply power and a device periphery of the amplifier circuit in response to an amplitude envelope of the input signal. In this manner, the amplifier control circuit can control the linearity and the efficiency of the amplifier circuit using the characteristics of the input signal itself, without relying on any external processing.

15 Claims, 4 Drawing Sheets

SELF-CONTROLLED HIGH EFFICIENCY POWER AMPLIFIER

BACKGROUND OF THE INVENTION

I. Field of the Invention

The present invention relates to signal amplifiers. More specifically, the present invention relates to a circuit and method for highly-efficient signal amplification over a wide dynamic range wherein the output level and intercept point are determined from the input level and modulation type of the input signal.

II. Description of the Related Art

In the field of wireless telecommunications, such as in various cellular, Personal Communication Services (PCS), and Wireless Local Loop (WLL) communication systems, many different communication standards exist. For example, Code-Division Multiple Access (CDMA) digital communications may be governed by either Telecommunications Industry Association (TIA)/Electronics Industries Association (EIA) Interim Standard IS-95 (series) for cellular systems, or by ANSI J-STD-008 for PCS systems. Additionally, Time-Division Multiple Access (TDMA) digital communications may be governed by the TIA/EIA IS-54, or by the European standard Global System for Mobile Communications (GSM). Furthermore, analog FM-based communications systems may be governed by the Advanced Mobile Phone System (AMPS) standard, or a related standard such as N-AMPS. Other wireless communication standards also exist for both digital and analog modulation.

For each of these communication system standards, a long-felt need exists for an amplifier for a wireless communication device which exhibits the high linearity needed for signal integrity, as well as the high efficiency needed for longer operating time. This is particularly true for dual-mode communication devices that can operate according to two different standards (such as CDMA/AMPS), because each of the standards may have different linearity requirements. For example, the linearity requirements in a CDMA communication device are more stringent than those of an AMPS communication device. Thus, a dual-mode digital/analog communication device would benefit greatly from being able to take advantage of a high linearity amplifier while operating in a digital mode where there may be strict linearity requirements, while still being able to operate with high efficiency while in an analog mode where the linearity requirements are more relaxed.

However, as is known in the art of amplifier design, high linearity and high efficiency are generally mutually exclusive design considerations. That is to say, when one is designing a particular transistor-based amplifier, one must usually make a trade-off between high linearity and high efficiency. The difference between high linearity and high efficiency is manifested by saturation characteristics which are determined by the load impedance in relation to the current capability and the breakdown voltage of the amplifier. In turn, the load impedance, current capability and breakdown voltage of the amplifier are a function of the amplifier device type, construction, periphery (e.g., gate area), and supply voltage. Thus, a designer who wishes to design a highly linear amplifier will generally choose a relatively low load impedance for a given supply voltage. Highly linear amplifiers maintain the integrity of the input signal envelope at the expense of higher average power dissipation. This high average power dissipation which results from overlap of current and voltage in the transistor over time is particularly undesirable in a battery-powered portable transmitter because it reduces battery life, and thus the transmit time, of the portable transmitter between battery charges.

Conversely, a designer who wishes to design a highly efficient amplifier will generally choose a relatively higher load impedance for the same supply voltage. Highly efficient amplifiers maintain a lower average power dissipation at the expense of "clipping" of the input signal at high input amplitudes due to premature saturation of the amplifier. Although clipping the input signal gives rise to high efficiency and longer battery life because the device's power dissipation is minimized during saturation, it results in distortion of the input signal envelope, and consequent generation of in-band spectral sidelobes. Furthermore, clipping generates higher-order harmonics that may be spread outside of the allowed operating bandwidth of the transmitter, causing interference to other RF devices transmitting or receiving on other frequencies.

Although there have been various attempts to create a highly efficient amplifier that is also highly linear, these attempts contain inherent problems which limit their effectiveness. For example, Doherty-type amplifiers are well known in the art as being highly efficient and also highly linear. A Doherty-type amplifier modulates the load impedance in response to the envelope of the input signal. In a Doherty-type amplifier, two amplifiers are connected in parallel, with the output of one of the amplifiers in series with a quarter-wavelength phase shifter. An example of such an amplifier is illustrated in U.S. Pat. No. 5,568,086 to Schuss et al, entitled "LINEAR POWER AMPLIFIER FOR HIGH EFFICIENCY MULTI-CARRIER PERFORMANCE." However, a significant drawback to the Doherty-type design of Schuss et al is that a quarter-wavelength phase shifter may be difficult and costly to realize at certain frequencies. Additionally, Doherty-type amplifiers are narrowband "tuned" amplifiers that operate best around a single frequency and are ill-suited for use in a broadband application such as digital wireless telephony.

Another example of a highly efficient amplifier is illustrated in U.S. Pat. No. 5,175,871 to Kunkel, entitled "POWER AMPLIFIER FOR A CELLULAR TELEPHONE." The amplifier of Kunkel uses a non-linear amplifier stage in conjunction with a separate linear amplifier stage. A switch is used to select the non-linear amplifier stage when non-linear behavior is desired, and to select the linear amplifier stage when linear behavior is desired. However, a significant drawback of Kunkel is the increased expense of providing two separate amplifiers, each with its own design characteristics.

In U.S. Pat. No. 5,661,434, entitled "HIGH EFFICIENCY MULTIPLE POWER LEVEL AMPLIFIER CIRCUIT," issued Aug. 26, 1997 to Brozovich et al, a high efficiency power amplifier is disclosed. The high efficiency power amplifier of Brozovich comprises a plurality of power amplifier stages coupled in a cascade configuration. At least one of the amplification stages includes a signal switching network for switching among one or any combination of the power amplifiers. A signal switch control circuit, external to the amplifier circuit, controls the switches. A drawback of this design is that the signal switch control circuit provides external control to the switches. By using external control to the switches, the complexity of hardware and software is increased.

Thus, there is a resultant need for an amplifier that is both highly efficient and highly linear which avoids the drawbacks inherent in other designs.

SUMMARY OF THE INVENTION

The present invention is a novel and improved circuit and method for amplifying an input signal. Broadly described, the circuit comprises an amplifier circuit having an input for receiving the input signal, and an amplifier control circuit, coupled to the amplifier circuit, for varying a supply power and a device periphery of the amplifier circuit in response to an amplitude envelope of the input signal. In this manner, the amplifier control circuit can control the linearity and the efficiency of the amplifier circuit using the characteristics of the input signal itself, without relying on any external processing.

An exemplary embodiment of the amplifier control circuit comprises an envelope detector that detects the input signal amplitude envelope, and that generates an envelope detection signal in response thereto. At least one threshold detector, coupled to the envelope detector, compares the envelope detection signal to a threshold, and generates a threshold comparison signal in response thereto. An amplitude-modulation (AM) detector, coupled to the envelope detector, detects whether there is amplitude modulation present on the input signal, and generates a mode detection signal in response thereto. At least one power regulator, coupled to the at least one threshold detector and the AM detector, varies the supply power in response to the threshold comparison signal and the mode detection signal.

An exemplary embodiment of the amplifier circuit of the present invention comprises a first amplifier stage and a second amplifier stage. The amplifier control circuit varies the device periphery of the amplifier circuit by independently enabling and disabling the first amplifier stage and the second amplifier stage.

In a first embodiment, the first and second amplifier stages are coupled in a cascade configuration. In this cascade configuration, the amplifier circuit may further comprise a first bypass switch, coupled to the first amplifier stage and the second amplifier stage and interposed therebetween, for bypassing the second amplifier stage in response to the threshold comparison signal and the mode detection signal, thereby disabling the second amplifier stage. Optionally, the cascade-configured amplifier circuit may further comprise an output matching network, coupled to an output of the amplifier circuit, and a second bypass switch, coupled to the first bypass switch and the output matching network and interposed therebetween. This additional shunt switch may be used to provide additional isolation when the amplifier circuit is operating in a high power mode.

In a separate cascade-configured embodiment, the second amplifier stage may comprise a feedthrough amplifier which includes an amplifier and a feedback network, coupled in parallel with the amplifier, such that signals incident at an input of the amplifier are conducted through the feedback network to an output of amplifier.

In another embodiment, the first and second amplifier stages are coupled in a parallel configuration. In the amplifier control circuit of this parallel configuration, a DC bias control circuit, coupled to the AM detector and the at least one threshold detector, selectively applies a DC bias voltage to an input of the first amplifier stage and to an input of the second amplifier stage in response to the threshold comparison signal and the mode detection signal. The DC bias control circuit thereby enables and disables individual ones of the parallel-configured stages.

The present invention also includes a method for amplifying an input signal in an circuit having an amplifier circuit controlled by an amplifier control circuit. The method, defined broadly, comprises the steps of detecting an amplitude envelope of the input signal, comparing the input signal amplitude envelope to a threshold, varying a device periphery of the amplifier circuit in response to the comparing step, determining a presence of amplitude-modulation (AM) in the input signal amplitude envelope, and varying a power supply to the amplifier circuit in response to the determining step. In this manner, the present invention uses the characteristics of the input signal to control the linearity and efficiency of the amplifier circuit.

Specifically, the method of the present invention varies the amplifier device periphery by increasing the device periphery if the input signal amplitude envelope is greater than or equal to the threshold, and by decreasing the device periphery if the input signal amplitude envelope is less than the threshold. Additionally, the method of the present invention varies the power supply to the amplifier circuit by increasing the power supply if AM is present in the input signal amplitude envelope, and by decreasing the power supply if AM is not present in the input signal amplitude envelope.

In an embodiment wherein the amplifier circuit comprises first and second amplifier stages, the method of the present invention varies the device periphery by independently enabling and disabling the first and second amplifier stages. In an embodiment wherein the first and second amplifier stages are coupled in a cascade configuration, the method of the present invention varies the device periphery by bypassing said second amplifier stage.

In an embodiment wherein the first and second amplifier stages are coupled in a parallel configuration, the method of the present invention varies the device periphery by selectively applying a DC bias voltage to an input of the first amplifier stage and an input of the second amplifier stage.

BRIEF DESCRIPTION OF THE DRAWINGS

The features, objects and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
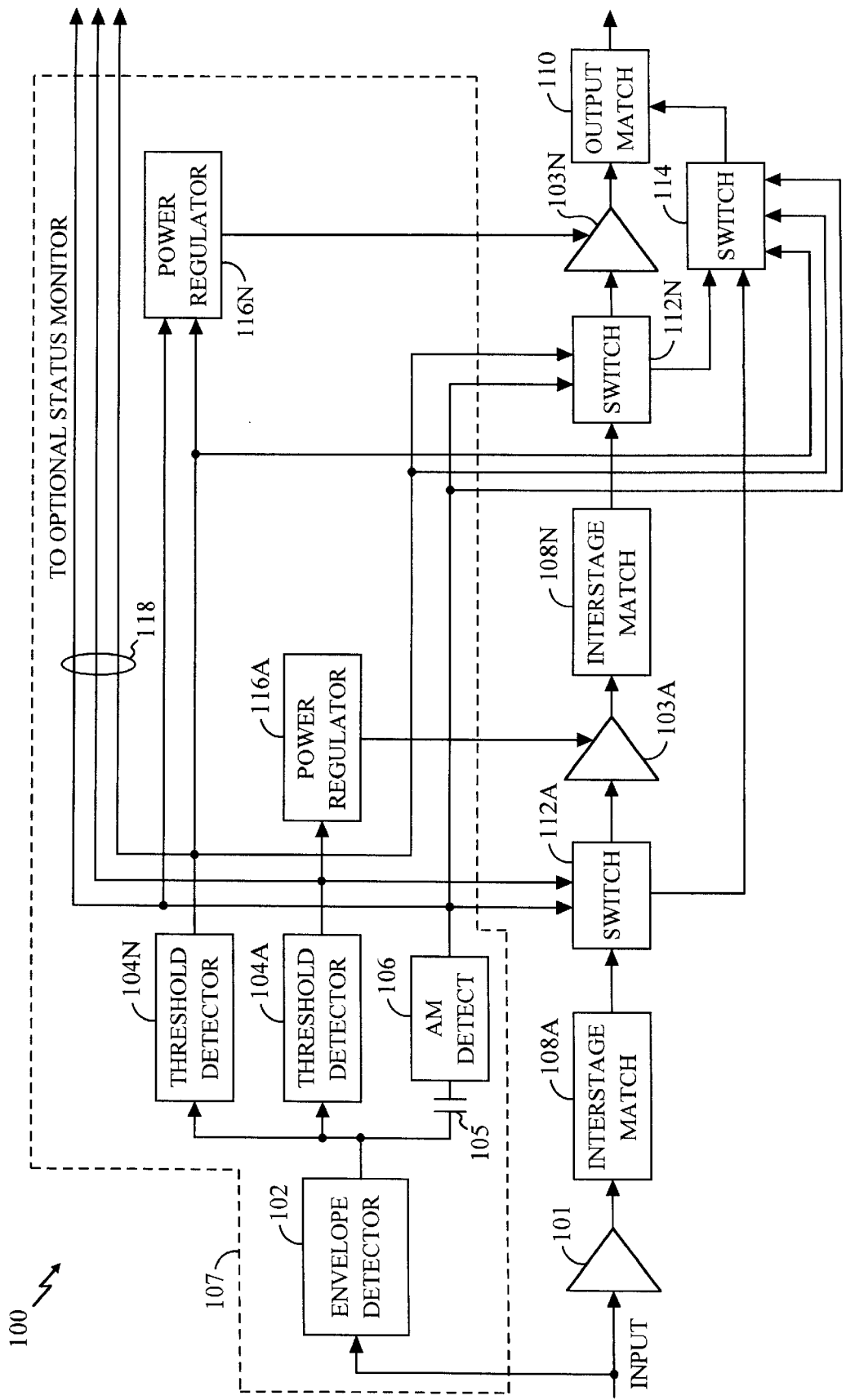
FIG. 1 is a functional block diagram of a first embodiment of the present invention which uses a cascaded amplifier stage configuration.

In FIG. 1, a functional block diagram of a first embodiment of the present invention is illustrated which uses a cascaded amplifier stage configuration. An input signal (INPUT) is applied to an input of a first amplifier stage 101 of a plurality of amplifier stages 101, 103A–103N and to an amplifier control circuit 107. In the embodiment of FIG. 1, amplifier control circuit comprises envelope detector 102, threshold detectors 104A–104N, DC blocking capacitor 105, AM detector 106, and power regulators 116A–116N. Together, these elements function to control the linearity and efficiency of amplifier circuit 100 by varying the amplifier device periphery and power supply in response to the input signal amplitude envelope.

The input signal may generally be a carrier signal modulated with information in amplitude, frequency, or phase. The input signal may be analog or digitally modulated. Amplifier stages 101, 103A–103N may be bipolar junction transistors (BJTs), field effect transistors (FETs), or any other transistor type as is known in the art, whether CMOS, NMOS, PMOS or otherwise. Additionally, other embodiments of the present invention may utilize amplifier stages 101, 103A–103N which are hybrid devices or tubes or TWTs as are known in the art. Also, although FIG. 1 is illustrated as having three amplifier stages 101, 103A–103N it is understood that more or fewer amplifier stages may be used. The present invention is not limited by the number or specific construction of each amplifier stage 101, 103A–103N.

The input signal applied to first amplifier stage 101 and envelope detector 102 may be either a digitally-modulated signal or an analog-modulated signal. In either case, it will have an amplitude envelope defined by the average voltage or current over a predetermined interval. Other embodiments define the amplitude envelope as the instantaneous voltage or current.

Envelope detector 102 measures the input signal amplitude envelope and outputs an envelope detection signal having an amplitude proportional to the input signal amplitude envelope.

Envelope detector 102 may be an off-the-shelf detector as is known in the art. The construction and operation of envelope detectors is well known in the art and will not be discussed in detail herein.

One or more threshold detectors 104A–104N are coupled to an output of envelope detector 102 and receive the envelope detection signal generated by envelope detector in response to the input signal amplitude envelope. Threshold detectors 104A–104N each compare the amplitude of the envelope detection signal to a respective threshold, and output a respective threshold comparison signal in response to the comparison. If the amplitude of the envelope detection signal is less than the respective threshold, the respective threshold comparison signal is set to a first level. If, on the other hand, the amplitude of the envelope detection signal is greater than or equal to the respective threshold, the respective threshold comparison signal is set to a second level.

In one embodiment, the respective thresholds for threshold detectors 104A–104N are set to different values. For example, the threshold for threshold detector 104A may be set to a value that is greater than the threshold for threshold detector 104N. As a result, threshold detector 104N may be set to "trip" (i.e. transition its threshold comparison signal from the first level to the second level) at a lower envelope detection signal amplitude than threshold detector 104A. Other embodiments use different threshold relationships. Additionally, other embodiments may use hysteresis among the threshold relationships to avoid excessive switching. For example, envelope detection signal level hysteresis or time duration hysteresis may be provided among threshold detectors 104A–104N.

As a result of this configuration, when a relatively small input signal amplitude envelope is detected by envelope detector 102, and therefore a relatively small envelope detection signal is output by envelope detector 102 in response thereto, none of the threshold detectors 104A–104N may "trip" in response to the envelope detection signal. Additionally, as the input signal amplitude envelope detected by envelope detector 102 increases, and therefore the envelope detection signal output by envelope detector 102 increases proportionally in response thereto, each of the threshold detectors 104A–104N may independently trip in response to the increasing envelope detection signal. It is clear that other embodiments may use other threshold configurations resulting in different but predictable behavior.

Each of the respective threshold comparison signals output by the threshold detectors 104A–104N are received by a respective one of a corresponding plurality of power regulators 116A–116N. Power regulators 116A–116N in turn regulate a respective power supply to a corresponding plurality of amplifiers 103A–103N in response to a respective threshold comparison signal output by each of the threshold detectors 104A–104N. Although FIG. 1 show power regulators 116A–116N as being coupled only to successive amplifier stages 103A–103N, in other embodiments additional power regulators (not shown) may be used to control amplifier stage 101 such that all amplifier stages 101, 103A–103N are regulated in response to respective threshold comparison signals output by threshold detectors 104A–104N.

In one embodiment, when the respective threshold comparison signal received by one of the power regulators 116A–116N is at the first level, the power regulator receiving that threshold comparison signal will output no supply power. Other embodiments may output a non-zero amount of supply power in response to a threshold comparison signal at the first level. On the other hand, when the respective threshold comparison signal received by that power regulator is at the second level, the power regulator receiving that threshold comparison signal will output a supply power determined at least partially in response to the output of AM detector 106 as further described below.

As a result, when the respective thresholds for threshold detectors 104A–104N are configured as described above, the power regulators 116A–116N will tend to output no supply power when the input signal amplitude envelope is relatively low, and will each "trip" independently (i.e. transition from outputting no supply power to outputting a supply power determined in response to the output of AM detector 106) as the input signal amplitude envelope increases.

The respective threshold comparison signals output by threshold detectors 104A–104N are also received by a corresponding plurality of bypass switches 112A–112N, 114. In one embodiment, each bypass switch 112A–112N, 114 bypasses its respective remaining amplifier stages 103A–103N when the respective threshold comparison signal that particular bypass switch receives is at the first level, and couples an amplified signal from a previous amplifier stage 101 or 103A to a remaining amplifier stage 103A–103N when the respective threshold comparison signal that bypass switch receives is at the second level. As a result, when the respective thresholds for threshold detectors 104A–104N are configured as described above, the bypass switches 112A–112N, 114 will tend to bypass their respective remaining amplifier stages 103A–103N when the input signal amplitude envelope is relatively low, and will each "trip" independently (i.e. transition from bypassing remaining amplifier stages to not bypassing remaining amplifier stages) as the input signal amplitude envelope increases.

As can be seen from the above description, in this embodiment the threshold detectors 104A–104N cooperate with their respective power regulators 116A–116N and bypass switches 112A–112N, 114 to effectively enable and disable successive amplifier stages 103A–103N as needed in response to the input signal amplitude envelope as measured by envelope detector 102. In other words, when a relatively small input signal amplitude envelope is detected, successive amplifier stages 103A–103N are "switched out" by their corresponding bypass switches 112A–112N, 114, and "turned off" by their corresponding power regulators 116A–116N. Conversely, as the amplitude of the input signal envelope increases, successive amplifier stages 103A–103N are independently "switched in" as needed by their corresponding bypass switches 112A–112N, 114 and "turned on" by their corresponding power regulators 116A–116N. This results in the amplifier circuit 100 device periphery being modulated according to the input signal amplitude envelope.

For example, suppose that the input signal amplitude envelope as measured by envelope detector 102 is at a minimum value, MIN, which requires that only the first amplifier stage 101 be activated. In such a case, the threshold detectors 104A–104N would not trip. As a result, power regulators 116A–116N would not supply power to successive amplifier stages 103A–103N, thereby "turning them off." Additionally, bypass switches 112A–112N, 114 would switch to bypass successive amplifier stages 103A–103N, thereby "switching them out." Thus, amplifier stages 103A–103N would be disabled. As a consequence, power that would otherwise go to supply successive amplifier stages 103A–103N would be saved, thereby increasing efficiency.

As a further example, consider the case when the input signal amplitude envelope as measured by envelope detector 102 is at a maximum value, MAX, which would require that all amplifier stages 101 and 103A–103N be activated. In such a case, the threshold detectors 104A–104N would each trip. As a result, power regulators 116A–116N would supply power to successive amplifier stages 103A–103N, thereby "turning them on." Additionally, bypass switches 112A–112N, 114 would switch to serially-connect successive amplifier stages 103A–103N, thereby "switching them in." Thus, amplifier stages 301A–301N would be enabled. As a consequence, the additional gain overhead provided by successive amplifier stages 103A–103N would be used, thereby increasing linearity.

Thus, it has been shown that the present invention uses the input signal amplitude envelope itself to control the configuration and operation of successive amplifier stages 103A–103N. It should be noted that the embodiment just described is merely one example embodiment of the present invention. Other embodiments may use threshold detectors 104A–104N which each have multiple thresholds, with each threshold corresponding to a different power supply value supplied to successive amplifier stages 103A–103N by power regulators 116A–116N. Taken to its logical conclusion, other embodiments of the present invention may be used to modulate the power consumption and device periphery continuously according to the input signal amplitude envelope rather than relying on discrete thresholds. Furthermore, although the above-described embodiment is disclosed having separate threshold detectors 104A–104N, separate power regulators 116A–116N, and separate bypass switches 112A–112N, 114, it will be readily understood by one skilled in the art that other embodiments may combine two or more of these functional elements into a single element without departing from the present invention.

In another aspect of the present invention, the high efficiency or high linearity mode of the successive amplifier stages 103A–103N are additionally controlled by a mode detection signal generated by AM detector 106 in response to the envelope detection signal generated by envelope detector 102. In FIG. 1, AM detector 106 is shown as being coupled to an output of envelope detector 102 through DC blocking capacitor 105. However, it is understood that in other embodiments, AM detector 106 may be combined with, and be an integral part of, envelope detector 102.

It is a well-known property of many analog frequency-modulated radio frequency signals used for wireless telecommunications that they contain little or no amplitude modulation. That is to say that there is no information carried in the amplitude envelope of a FM signal. As a result, and as previously stated, the linearity requirements for analog FM radio frequency signals used in telecommunications are generally relaxed. It is equally well known that many digitally-modulated radio frequency signals used for wireless telecommunications do contain a significant amount of amplitude modulation. That is to say that there is information carried in the amplitude envelope of a digitally-modulated radio frequency signal, such as a CDMA telecommunications signal. As a result, and as previously stated, the linearity requirements for digitally-modulated signals are generally strict.

In the present invention, AM detector 106 detects the presence or absence of amplitude modulation on the INPUT signal via the envelope detection signal generated by envelope detector 102. AM detector 106 may be any suitable off-the-shelf AM detector as is known in the art. The construction and operation of AM detectors is well known in the art and will not be described in detail herein.

The mode detection signal generated by AM detector 106 indicates the presence or absence of amplitude modulation on the INPUT signal. If there is little or no AM information present on the INPUT signal, then the INPUT signal is presumed to be an analog FM signal. If there is a significant amount of AM information present on the INPUT signal, then the INPUT signal is presumed to be a digitally-modulated signal. For example, in one embodiment, the mode detection signal generated by AM detector 106 is a simple voltage signal that is at a high level when the INPUT signal is a digitally-modulated signal, and is at a low level when the INPUT signal is an analog FM signal.

The mode detection signal is used in conjunction with the threshold comparison signals to control the configuration of the successive amplifier stages 103A–103N. With respect to power regulator 116N, when AM detector 106 detects the presence of significant amplitude modulation on the INPUT signal, it outputs a mode detection signal which causes power regulator 116N to output a lower power supply level to amplifier stage 103N as described above, thereby decreasing its linear operating range and increasing its efficiency by imposing saturation at a lower input level. Conversely, when AM detector 106 detects the presence of little or no amplitude modulation on the INPUT signal, it outputs a mode detection signal which causes power regulator 116N to output a higher power supply level to amplifier stage 103N as described above, thereby increasing its linear operating range and decreasing its efficiency by imposing saturation at a higher input level. It should be noted that although in FIG. 1, AM detector 106 is not coupled to power regulator 116A, in other embodiments AM 15 detector 106A may control any or all of power regulators 116A–116N and their associated amplifier stages 103A–103N.

The mode detection signal generated by AM detector 106 also controls the operation of bypass switches 112A–112N, 114. When the INPUT signal is an analog FM signal, and therefore additional efficiency may be obtained at the expense of linearity, the mode detection 20 signal may be used to cause any or all of bypass switches 112A–112N, 114 to complete a bypass path around successive amplifier stages 103A–103N as described above, thereby "switching them out." Conversely, when the INPUT signal is a digitally-modulated signal, and therefore additionally linearity is desired at the expense of efficiency, the mode detection signal may be used to cause any or all of bypass switches 112A–112N, 114 to serially connect successive amplifier stages 103A–103N as described above, thereby "switching them in." It should be noted that in other embodiments, AM detector 106 may control more or fewer of the bypass switches 112A–112N, 114. Thus, as shown and described above, the present invention may be used to control and configure cascaded amplifier stages using both the amplitude envelope and modulation type of the INPUT signal itself.

Additionally, as shown in FIG. 1, bypass switch 114 may be connected in parallel with amplifier stage 103N, and furthermore integrated into output matching network 110 to ensure low signal swing on the bypass switch 114 during operation in a high-power mode. The configuration of bypass switch 114 as shown in FIG. 1 improves isolation in the reverse path from the output matching network 110 back to the input of amplifier stage 103N. However, in other embodiments, bypass switch 114 may be omitted entirely, with the bypass output of bypass switch 112N being directly connected to output matching network 110. Output matching network 110 may be any passive impedance matching network as is known in the art for interfacing an amplifier with a load.

Also in FIG. 1, a plurality of interstage matching networks 108A–108N are illustrated as being serially connected to amplifier stages 101, 103A–103N and interposed therebetween. Interstage matching networks 108A–108N provide the proper impedance match between successive amplifier stages 101, 103A–103N. Interstage matching networks 108A–108N may be passive networks as are known in the art. The construction and operation of interstage matching networks 108A–108N are well known in the art and will not be described in detail herein.

Also in FIG. 1, optional status lines 118 are illustrated as being coupled to the outputs of threshold detectors 104A–104N and AM detector 106 for carrying the threshold comparison signals and mode detection signals to an optional status monitor (not shown).

Figure 2A:
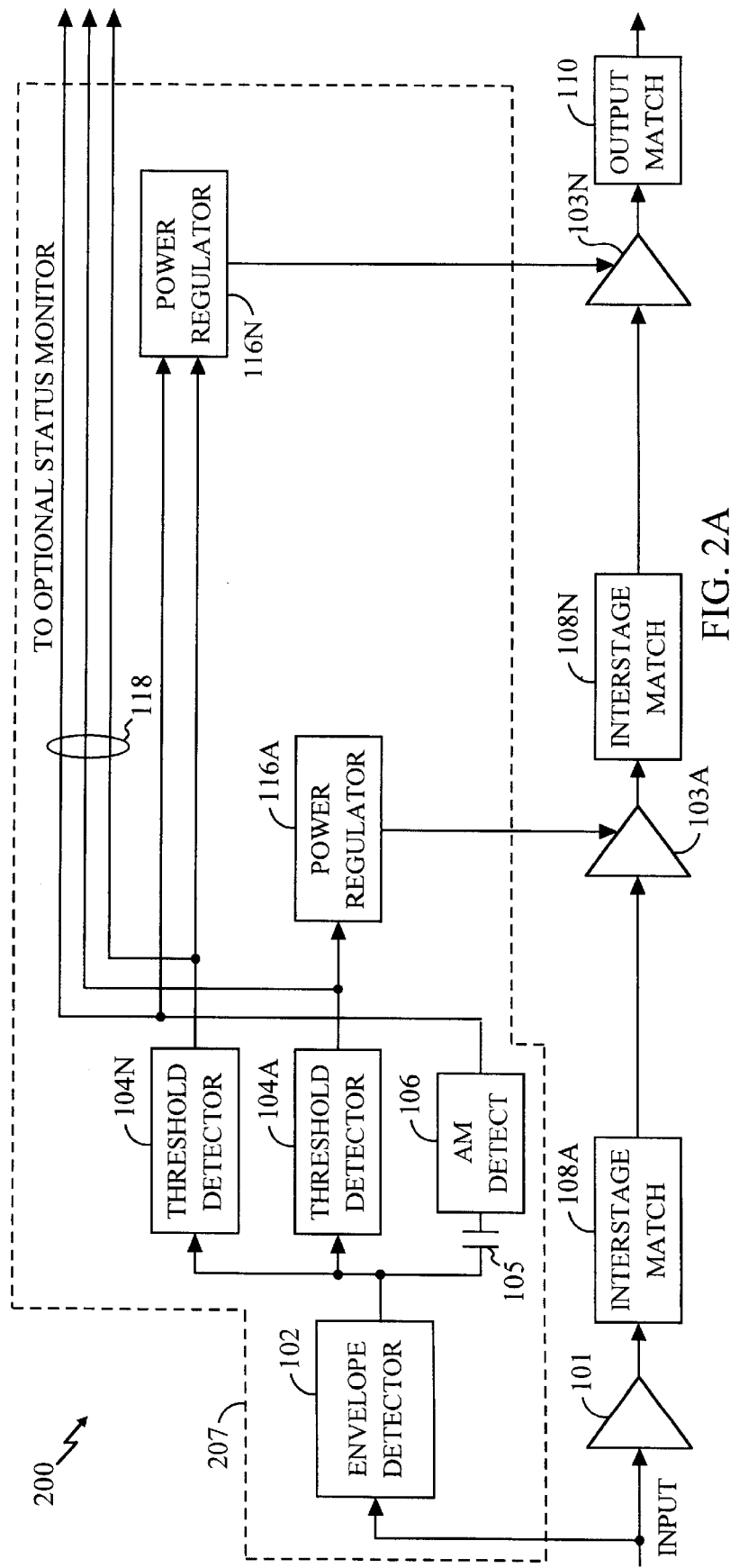
FIG. 2A is a functional block diagram of a second embodiment of the present invention which uses a cascaded amplifier stage configuration having feedthrough amplifiers.
Figure 2B:
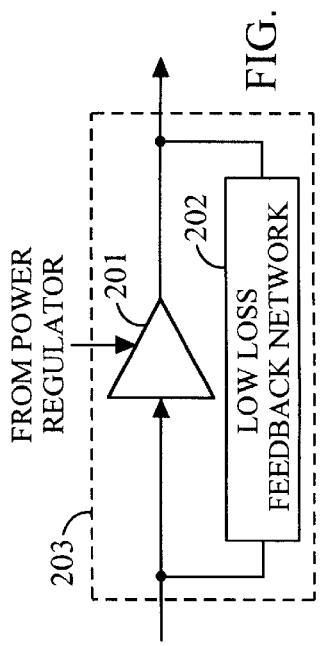
FIG. 2B is an expanded functional block diagram of one of the feedthrough amplifiers of FIG. 2A.

An alternate embodiment of a cascade amplifier circuit 200, similar to that shown in FIG. 1, is illustrated in FIGS. 2A and 2B. The circuit topology of FIG. 2A is similar to that of FIG. 1 with the exception of the removal of bypass switches 112A–112N, 114 and their associated control lines. Rather than the "explicit" bypass switching of FIG. 1 which uses discrete switching, FIG. 2A illustrates a configuration where amplifier stage bypass is performed "implicitly" by operation of amplifier stages 103A–103N themselves. In the embodiment of FIG. 2A, amplifier stages 103A–103N are feedthrough amplifiers having low loss feedback. Like amplifier control circuit 107 of FIG. 1, amplifier control circuit 207 of FIG. 2A functions to control the linearity and efficiency of amplifier circuit 200 by varying the amplifier device periphery and power supply in response to the input signal amplitude envelope.

FIG. 2B illustrates one embodiment of a feedthrough amplifier stage 203 which may be advantageously used as any or all of the amplifier stages 101, 103A–103N of FIG. 2A. Feedthrough amplifier 203 comprises an amplifier stage 201 in parallel with a low loss feedback network 202. As described above with reference to amplifier stages 101, 103A–103N, amplifier stage 201 may be any amplifier as is known in the art.

In operation, low loss feedback network 202 provides a feedthrough path for signals incident at the input to amplifier stage 201. When power is supplied to amplifier stage 201 by any of power regulators 116A–116N, amplifier stage 201 amplifies any signal incident at its input, and sums it with any unamplified signal components that travel through low loss feedback network 202. However, when power is removed from amplifier stage 201, the low loss feedback network 202 still provides a feedthrough path for an unamplified signal, thereby implicitly bypassing amplifier stage 201. Low loss feedback network 202 may be any passive feedback network as is known in the art.

One advantage of the implicit bypass embodiment of FIG. 2A is that it avoids the transients and timing considerations associated with the network of bypass switches 112A–112N, 114 of FIG. 1. However, it introduces additional losses through the low loss feedback network 202. Thus, the embodiment of FIG. 2A is most advantageous when the losses through low loss feedback network 202 can be minimized by choosing low loss components and circuit topologies for low loss feedback network 202.

Figure 3:
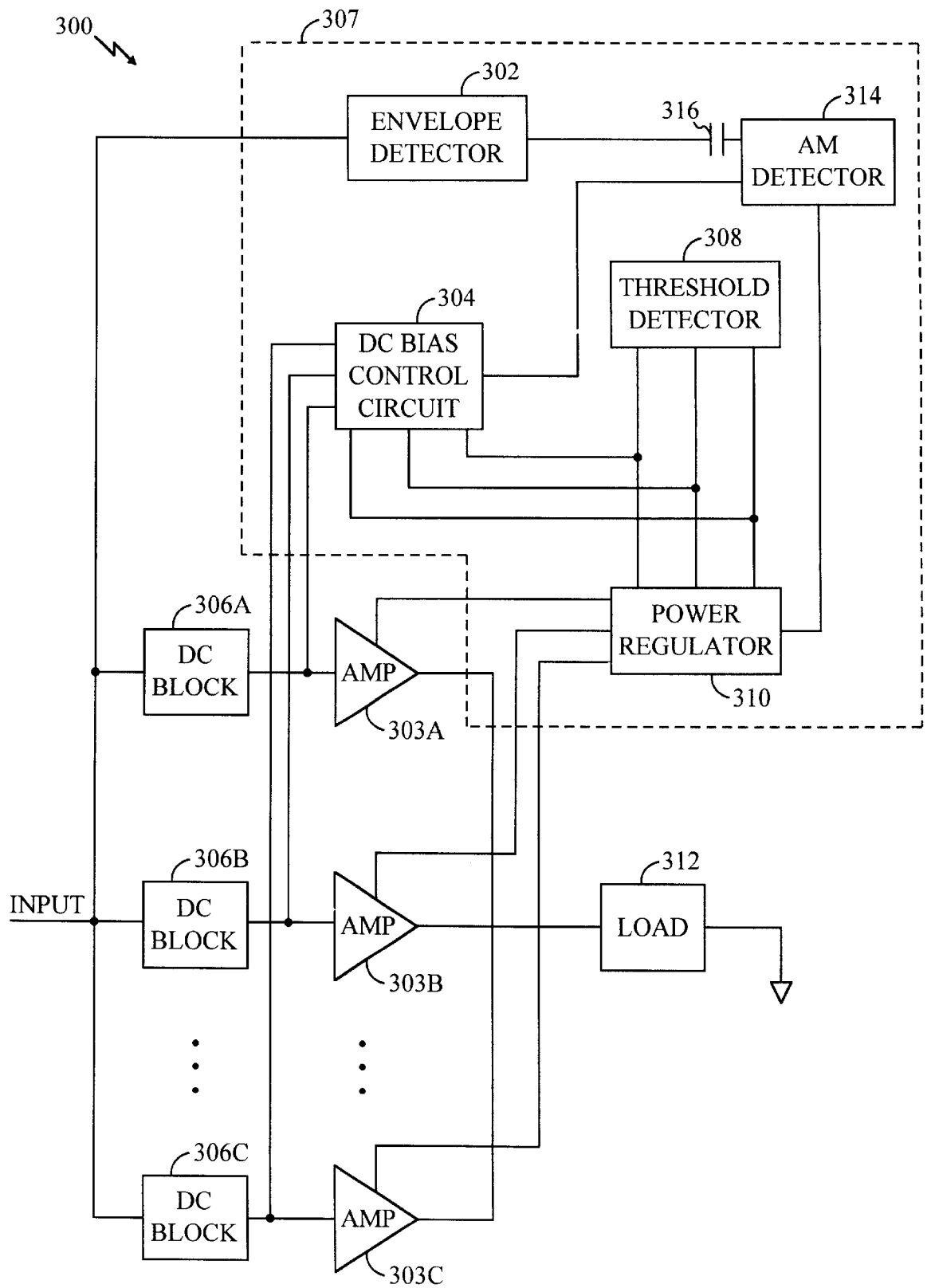
FIG. 3 is a functional block diagram of a third embodiment of the present invention which uses a parallel amplifier stage configuration.

Turning now to FIG. 3, an alternate embodiment of the present invention which uses a parallel amplifier stage configuration is illustrated. In contrast to the embodiments of FIGS. 1 and 2A, FIG. 3 comprises a plurality of amplifier stages 301A–301N which are coupled in a parallel, rather than in a cascade, configuration.

In FIG. 3, the INPUT signal is presented to the inputs of DC blocks 303A–303N. In the simplest embodiment, DC blocks 106A–106N may be DC blocking capacitors. At the high frequencies of the RF input signal, the DC blocks 301A–301N pass the INPUT signal through to respective parallel amplifier stages 301A–301N. As in FIGS. 1, 2A and 2B, amplifier stages 301A–301N may be bipolar junction transistors (BJTs), field effect transistors (FETs) or any other transistor type as is known in the art. Although only three parallel amplifier stages 301A–301N are illustrated in FIG. 3, it would be well understood by a person of ordinary skill in the art that other embodiments may include more or fewer amplifier stages. The INPUT signal is also presented to amplifier control circuit 307. Like amplifier control circuit 107 of FIG. 1 and amplifier control circuit 207 of FIG. 2A, amplifier control circuit 307 of FIG. 3 functions to control the linearity and efficiency of amplifier circuit 300 by varying the amplifier device periphery and power supply in response to the input signal amplitude envelope.

When biased on by respective power regulators 316A–316N, each amplifier stage 301A–301N independently amplifies the INPUT signal according to a gain characteristic determined by the device's construction and the power supply level applied to it. The outputs of amplifier stages 301A–301N are combined and applied to a load 318 which, for example, may include a matching network, a diplexer, an isolator, and an antenna in a wireless communication device.

Another difference between the embodiment illustrated in FIG. 3 and that of FIGS. 1 and 2A is that instead of multiple threshold detectors 104A–104N of FIGS. 1 and 2A, the embodiment of FIG. 3 has combined these functional elements into a single threshold detector block 308. Likewise, the multiple power regulators 116A–116N of FIGS. 1 and 2A have been combined into a single power regulator block 310. It is understood that the combination or separation of these functional elements does not limit the present invention.

In operation, envelope detector 302 functions similarly to its counterpart envelope detector 102 of FIGS. 1 and 2A. Specifically, envelope detector 302 generates an envelope detection signal having an amplitude proportional to the input signal amplitude envelope. Likewise, the threshold detector 308 functions similarly to the threshold detectors 104A–104N of FIGS. 1 and 2A. Namely, threshold detector 308 compares the envelope detection signal to a plurality of thresholds.

Threshold detector 306 has a plurality of outputs for generating respective threshold comparison signals. These threshold comparison signals are provided to power regulator 310. Power regulator 310 operates similarly to the multiple power regulators 116A–116N of FIGS. 1 and 2A. Namely, power regulator 310 supplies power to each of the amplifier stages 303A–303N in response to the threshold comparison signals received from threshold detector 308.

Additionally, AM detector 314 functions similarly to AM detector 106 of FIGS. 1 and 2A. Namely, AM detector 314 detects the presence or absence of amplitude modulation on the envelope detection signal generated by envelope detector 302, and therefore the INPUT signal itself. AM detector 314 outputs a mode detection signal indicative of the presence or absence of amplitude modulation in the INPUT signal. The mode detection signal is received as a further input to power regulator 310, and as an input to DC bias control circuit 304.

DC bias control circuit 304 comprises the DC power sources and logic necessary to selectively apply a DC bias to any or all of amplifier stages 303A–303N. DC bias control circuit 304 is controlled by the respective threshold comparison signals generated by threshold detector 308 and the mode detection signal generated by AM detector 314 in much the same way as bypass switches 112A–112N of FIG. 1. DC bias control circuit 304 selectively applies a DC bias to the inputs of amplifier stages 303A–303N in order to switch the individual amplifier stages on or off. For example, if each of the amplifier stages 303A–303N is a FET with a maximum output power of one watt, DC bias control circuit 304 might apply a DC bias to the gates of amplifier stages 303A and 303B only in order to get a maximum output through load 312 of two watts. Similarly, for an output power though load 312 of one watt only, DC bias control circuit 304 might apply a DC bias to the gate of amplifier stage 303A only, it being understood that the remainder of the amplifier stages 303B–303N would not be active in the absence of a DC bias applied to their gates. A similar scheme may be followed in an alternate embodiment where amplifier stages 303A–303N are BJT devices, with the DC bias being applied to their respective bases. It also should be noted that in another embodiment, DC bias control circuit 304 may be combined with power regulator 310.

In the present invention, the appropriate number of amplifier stages 303A–303N to enable or disable is selected in response to the input signal amplitude envelope itself, as detected by envelope detector 302, as well as AM detector 314. In this way, the amplifier device 300 periphery is modulated according to the input signal amplitude envelope. A similar topology which uses external control circuitry, rather than the input signal itself, to control the configuration of the amplifier stages 303A–303N is described in U.S. Pat. No. 6,069,525, issued May 30, 2000, entitled "DUAL-MODE AMPLIFIER WITH HIGH EFFICIENCY AND HIGH LINEARITY," and assigned to the assignee of the present invention, and incorporated herein by reference.

In operation, the embodiment of FIG. 3 also varies the power supply to each amplifier stage 303A–303N according to the threshold detection signals and the mode detection signal. For example, when the INPUT signal is detected by envelope detector 302 to be at a relatively low level, only one of the plurality of threshold values in threshold detector 308 may be met, resulting in DC bias control circuit 304 applying a DC bias to the input of only one of the amplifier stages 303A–303N, thereby enabling it. On the other hand, when the INPUT signal is detected by the envelope detector 302 to be at a relatively high level, more than one of the plurality of threshold values in threshold detector 308 may be met, resulting in DC bias control circuit 304 applying a DC bias to the input of more than one of the amplifier stages 303A–303N, thereby enabling them.

Additionally, when AM detector 314 detects little or no amplitude modulation on the INPUT signal, it will output a mode detection signal which causes power regulator 310 to reduce the supply voltage to the active amplifier stages 303A–303N to increase the efficiency at the expense of linearity for the analog FM input signal. On other hand, when AM detector 314 detects significant amplitude modulation on the INPUT signal, it will output a mode detection signal which causes power regulator 310 to increase the supply voltage to the active amplifier stages 303A–303N to increase the linearity at the expense of efficiency for the digitally-modulated input signal.

Figure 4:
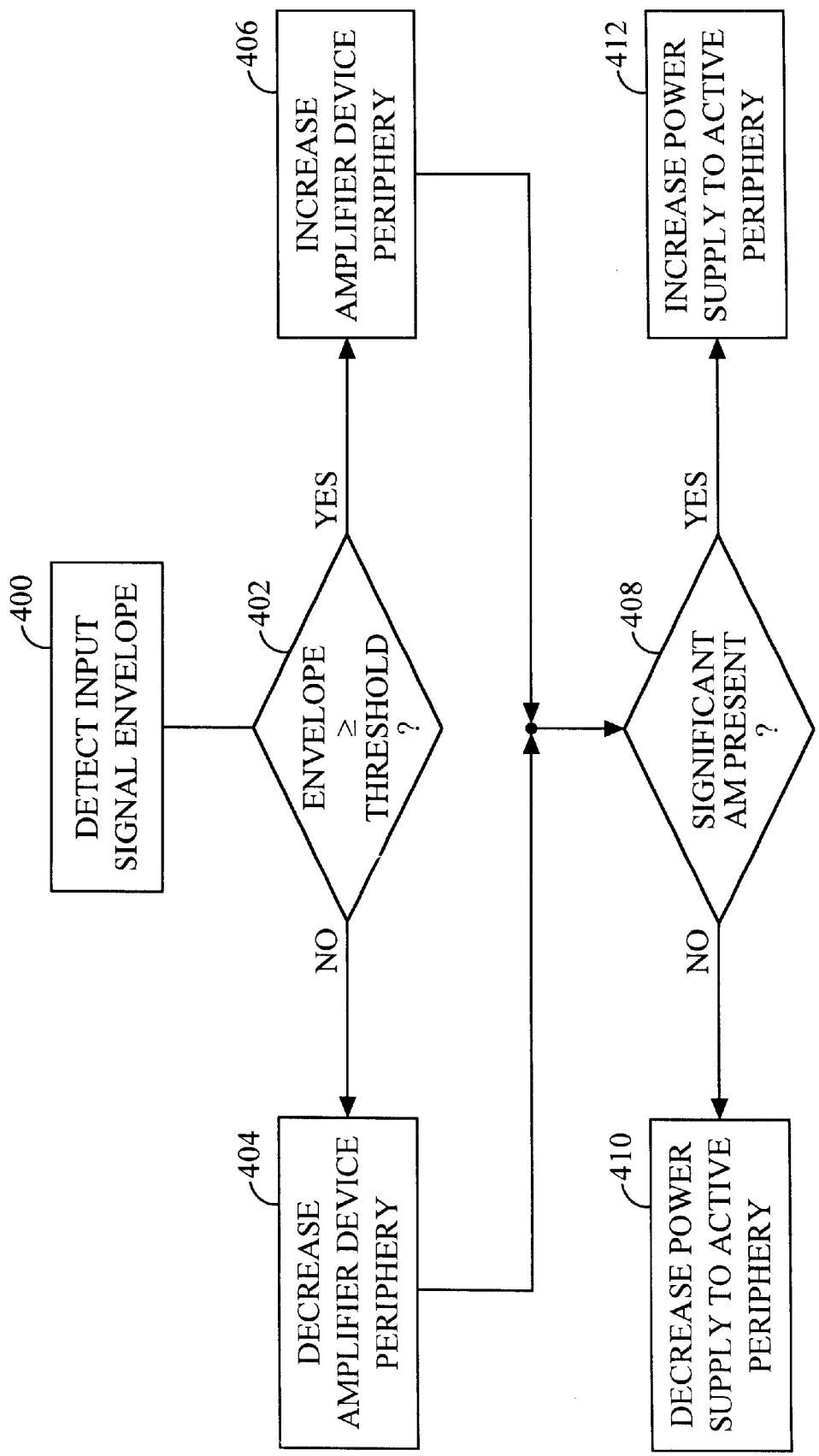
FIG. 4 is a flow diagram of the method of the present invention.

Turning now to FIG. 4, a flow diagram of the method of the present invention, suitable for use with any of the above-described embodiments, is shown. The method begins at block 400 where the input signal envelope is detected. Such detection may be both for amplitude and modulation type (e.g. FM or digital). Upon detection of the input signal envelope at block 400, the input signal envelope is compared with at least one threshold at decision 402. If the detected input signal envelope is greater than or equal to the at least one threshold as determined at decision 402, then the flow moves to bock 406 where the active amplifier device periphery is increased. If, on the other hand, the detected input signal envelope is less than the threshold as determined at decision 402, then the flow moves to block 404 where the active amplifier device periphery is decreased.

Whether from block 404 or block 406, the flow proceeds to decision 408 where the modulation type of the input signal is determined by detecting whether significant amplitude modulation is present in the input signal envelope. If there is significant AM in the input signal envelope as determined by decision 408, the flow proceeds to block 412 where the power supply to active amplifier periphery is increased. If, on the other hand, there is not significant AM present in the input signal envelope as determined by decision 408, the flow proceeds back to block 410 where the power supply to active periphery is decreased.

The previous description of the preferred embodiments is provided to enable any person skilled in the art to make or use the present invention. The various modifications to these embodiments will be readily apparent to those skilled in the art, and the generic principles defined herein may be applied to other embodiments without the use of inventive faculty. Thus, the present invention is not intended to be limited to the embodiments shown herein, but is to be accorded the widest scope consistent with the principles and novel features disclosed herein.

I claim:

1. A circuit comprising:

an amplifier circuit having an input for receiving an input signal; and an amplifier control circuit for varying a supply power and a device periphery of the amplifier circuit in response to an amplitude envelope of the input signal, the amplifier control circuit having:

an envelope detector for detecting the input signal amplitude envelope, and for generating an envelope detection signal in response thereto;

at least one threshold detector, coupled to the envelope detector, for comparing the envelope detection signal to a threshold, and for generating a threshold comparison signal in response thereto;

an amplitude-modulation (AM) detector, coupled to the envelope detector, for detecting amplitude modulation of the input signal, and for generating a mode detection signal in response thereto; and at least one power regulator, coupled to the at least one threshold detector and the AM detector, for varying the supply power in response to the threshold comparison signal and the mode detection signal.

2. The circuit of claim 1, wherein the amplifier circuit includes a first amplifier stage and a second amplifier stage coupled thereto, the amplifier control circuit varying the device periphery of the amplifier circuit by independently enabling and disabling the first amplifier stage and the second amplifier stage.

3. The circuit of claim 1, wherein the first and second amplifier stages are coupled in a cascade configuration.

4. The circuit of claim 3, wherein the amplifier circuit further comprises a first bypass switch, coupled to the first amplifier stage and the second amplifier stage and interposed therebetween, for bypassing the second amplifier stage in response to the threshold comparison signal and the mode detection signal.

5. The circuit of claim 4, wherein the amplifier circuit further comprises:

an output matching network, coupled to an output of the amplifier circuit; and a second bypass switch, coupled to the first bypass switch and the output matching network and interposed therebetween.

6. The circuit of claim 3, wherein the second amplifier stage comprises a feedthrough amplifier.

7. The circuit of claim 6, wherein the feedthrough amplifier comprises:

an amplifier, and a feedback network, coupled in parallel with the amplifier, such that signals incident at an input of the amplifier are conducted through the feedback network to an output of the amplifier.

8. The circuit of claim 2, wherein the first and second amplifier stages are coupled in a parallel configuration.

9. The circuit of claim 8, wherein the amplifier control circuit further comprises a DC bias control circuit, coupled to the AM detector and the at least one threshold detector, the DC bias control circuit for selectively applying a DC bias voltage to an input of the first amplifier stage and to an input of the second amplifier stage in response to the threshold comparison signal and the mode detection signal.

10. A method of amplifying an input signal in a circuit having an amplifier circuit controlled by an amplifier control circuit, the method comprising:

detecting an amplitude envelope of the input signal;

comparing the input signal amplitude envelope to a threshold;

varying a device periphery of the amplifier circuit in response to the comparing;

identifying a presence of amplitude-modulation (AM) in the input signal amplitude envelope; and varying a power supply to the amplifier circuit in response to the presence of AM.

11. The method of claim 10, wherein varying the device periphery comprises:

increasing the device periphery when the input signal amplitude envelope is greater than or equal to the threshold; and decreasing the device periphery when the input signal amplitude envelope is less than the threshold.

12. The method of claim 10, wherein varying the power supply comprises:

increasing the power supply when AM is present in the input signal amplitude envelope; and decreasing the power supply when AM is not present in the input signal amplitude envelope.

13. The method of claim 10, wherein the amplifier circuit comprises first and second amplifier stages and wherein varying the device periphery comprises independently enabling and disabling the first and second amplifier stages.

14. The method of claim 13, wherein the first and second amplifier stages are coupled in a cascade configuration and wherein varying the device periphery further comprises bypassing the second amplifier stage.

15. The method of claim 13, wherein the first and second amplifier stages are coupled in a parallel configuration and wherein varying the device periphery further comprises selectively applying a DC bias voltage to an input of the first amplifier stage and an input of the second amplifier stage.

* * * * *